(12) United States Patent
Hayami et al.

(10) Patent No.: US 7,368,876 B2
(45) Date of Patent: May 6, 2008

(54) PLASMA PROCESSING APPARATUS

(75) Inventors: Toshihiro Hayami, Nirasaki (JP); Etsuji Ito, Nirasaki (JP); Itsuko Sakai, Yokohama (JP)

(73) Assignees: Tokyo Electron Limited, Tokyo (JP); Kabushiki Kaisha Toshiba, Tokyo (JP)

( * ) Notice: Subject to any disclaimer, the term of this patent is extended or adjusted under 35 U.S.C. 154(b) by 456 days.

(21) Appl. No.: 10/854,142

(22) Filed: May 27, 2004

(65) Prior Publication Data

US 2005/0011452 A1    Jan. 20, 2005

Related U.S. Application Data

(63) Continuation of application No. PCT/JP02/12303, filed on Nov. 26, 2002.

(30) Foreign Application Priority Data

Nov. 27, 2001    (JP)    ............... 2001-361297

(51) Int. Cl.
*H01J 7/24*    (2006.01)
(52) U.S. Cl. ............... 315/111.21; 315/111.11
(58) Field of Classification Search ........... 315/111.01, 315/111, 21, 111.11; 216/67; 156/345.29, 156/345.33, 345.35, 345.36, 345.41, 345.44, 156/345.48
See application file for complete search history.

(56) References Cited

U.S. PATENT DOCUMENTS

| | | | |
|---|---|---|---|
| 4,935,661 A * | 6/1990 | Heinecke et al. ....... | 315/111.21 |
| 5,478,429 A * | 12/1995 | Komino et al. ........ | 156/345.44 |
| 5,542,559 A | 8/1996 | Kawakami et al. ........... | 216/67 |
| 6,222,718 B1 | 4/2001 | Dible ......................... | 361/234 |
| 6,326,584 B1 * | 12/2001 | Jewett et al. .......... | 219/121.57 |
| 6,570,394 B1 * | 5/2003 | Williams .................... | 324/620 |
| 6,983,174 B2 * | 1/2006 | Hoppenstein et al. .... | 455/562.1 |
| 2002/0185227 A1* | 12/2002 | MacGearailt .......... | 156/345.43 |
| 2003/0022645 A1* | 1/2003 | Runzo ..................... | 455/226.2 |

FOREIGN PATENT DOCUMENTS

| | | |
|---|---|---|
| JP | 5-291150 | 11/1993 |
| JP | 2000-328248 | 11/2000 |
| WO | WO 03/046959 | 6/2003 |

* cited by examiner

*Primary Examiner*—Thuy Vinh Tran
(74) *Attorney, Agent, or Firm*—Oblon, Spivak, McClelland, Maier & Neustadt, P.C.

(57) ABSTRACT

A low-cost plasma processing apparatus which permits reduction of the cost, as well as reduction of the loss of transmitted power. The plasma processing apparatus 1 has an apparatus main body 2 and auxiliary equipment 3. The auxiliary equipment 3 is comprised of a power supply apparatus 5 that supplies power to a processing chamber 4, and a plurality of dry pumps 6 and 7, and so on. The power supply apparatus 5 is comprised of a matching unit 9, an RF amplifier 13 that is connected to the matching unit 9 via a coaxial cable 24, and a power controller 12 having a DC amplifier 14 therein. The RF amplifier 13 is formed in a separate body to the DC amplifier 14 and disposed in a position away from the DC amplifier 14 and close to the matching unit 9, and is connected to the DC amplifier 14 via an ordinary cable 25.

11 Claims, 3 Drawing Sheets

PLASMA PROCESSING APPARATUS

This Application is a continuation of PCT/JP02/12303 filed on Nov. 26, 2002 claiming the benefit of Japan Application No. 2001-361297 filed on Nov 27, 2001.

TECHNICAL FIELD

The present invention relates to a plasma processing apparatus that carries out predetermined plasma processing on objects to be processed such as semiconductor wafers or glass substrates.

BACKGROUND ART

A conventional plasma processing apparatus, for example a plasma processing apparatus 1 as shown in FIG. 3, has an apparatus main body 2 and auxiliary equipment 3. The apparatus main body 2 has a processing chamber 4 in which a sequence of processes is carried out on objects to be processed such as semiconductor wafers or glass substrates, for example oxide film formation processing of forming an oxide film, etching processing, and ashing processing. The auxiliary equipment 3 has a VHF apparatus (hereinafter referred to as the "power supply apparatus") 5 that supplies power to the processing chamber 4 in which the sequence of processing is carried out on the semiconductor wafers, and a plurality of dry pumps 6 and 7 that are connected to the apparatus main body 2.

The power supply apparatus 5 is comprised of a matching unit 9 that is connected to the processing chamber 4 via a power-feeding rod-shaped cable 8, a circulator 11 that is connected to the matching unit 9 via a coaxial cable 10, and a power controller 12.

The power controller 12 has therein an RF amplifier 13 and a DC amplifier 14 that are formed in one body; a commercial power source 16 is connected to the DC amplifier 14 via a cable 15, and the RF amplifier 13 is connected to the circulator 11 via a coaxial cable 17. The coaxial cable 17 has high flexural rigidity, and is high in price per unit length, and furthermore the power loss is high when power is transmitted at high frequency (i.e. radio frequency (RF)) in particular, and hence it is desirable to make the wiring length as short as possible.

Usually, the apparatus main body 2, the matching unit 9 and the circulator 11 of such a plasma processing apparatus 1 are disposed in a clean room A upstairs, and the dry pumps 6, 7 and so on, and the power controller 12 of the power supply apparatus 5, which are permitted to be disposed in a space having a low degree of cleanliness, are disposed in a utility section B downstairs, whereby the footprint of the clean room, in which a high degree of cleanliness is required, can be reduced.

However, if the circulator 11 is disposed upstairs and the RF amplifier 13 is disposed downstairs as described above, then the wiring length of the coaxial cable 17 that connects the circulator 11 and the RF amplifier 13 together becomes long, and hence there are problems such as the cost of the power supply apparatus 5 increasing, and the power loss when power is transmitted at high frequency increasing, and moreover the reproducibility and stability of the transmitted power dropping.

It is an object of the present invention to provide a plasma processing apparatus which permits reduction of the cost, as well as reduction of the loss of transmitted power.

DISCLOSURE OF THE INVENTION

To attain the above object, according to the present invention, there is provided a plasma processing apparatus comprising a processing chamber in which objects to be processed are processed, power supply means for supplying RF power to the processing chamber, exhausting means for evacuating an interior of the processing chamber to a predetermined reduced pressure state, and processing gas introducing means for introducing a processing gas into the processing chamber, the plasma processing apparatus forming an RF electric field inside the processing chamber through the supplied RF power, and thus converting the introduced processing gas into a plasma, and carrying out plasma processing; wherein the power supply means comprises a matching unit that is connected to the processing chamber via a transmission path along which the RF power is transmitted to the processing chamber, and that matches an impedance of the transmission path to an impedance of the processing gas that has been converted into the plasma, an RF amplifier that is connected to the matching unit, and a DC amplifier that is connected to the RF amplifier, wherein the RF amplifier is formed in a separate body to the DC amplifier and disposed in a position away from the DC amplifier and close to the matching unit.

Preferably, the RF amplifier is connected to the matching unit via a coaxial cable.

Preferably, the DC amplifier is connected to the RF amplifier via an ordinary cable.

Preferably, the plasma processing apparatus further comprises a clean room housing the processing chamber and the matching unit, and a utility section adjacent to the clean room, wherein the RF amplifier is installed in the clean room, and the DC amplifier is installed in the utility section.

Preferably, the utility section is disposed downstairs from the clean room.

Preferably, the plasma processing apparatus further comprises a circulator that is built into the RF amplifier.

BEST MODE FOR CARRYING OUT THE INVENTION

A plasma processing apparatus according to an embodiment of the present invention will now be described in detail with reference to the drawings.

Figure 1:
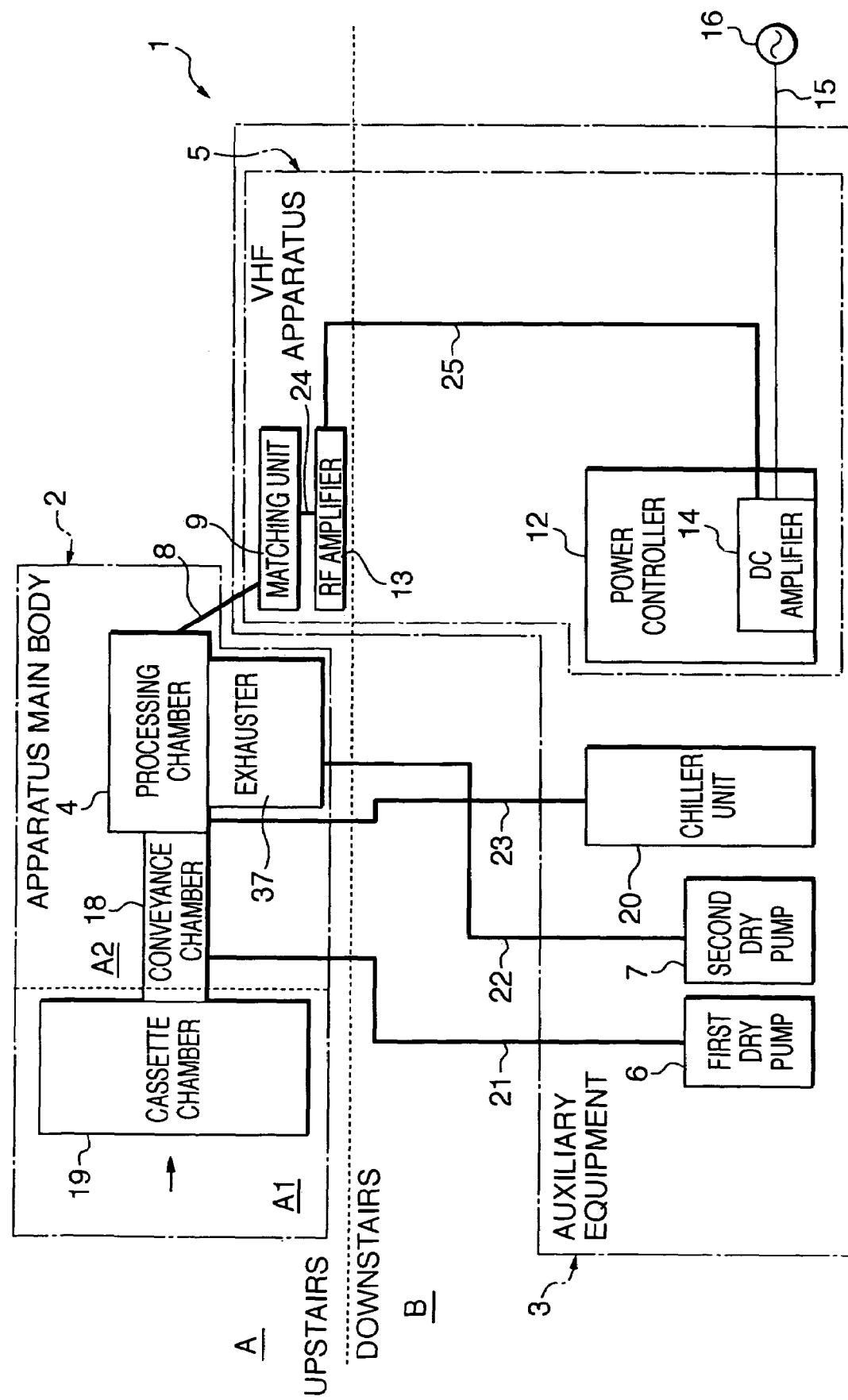
FIG. 1 is a view schematically showing the construction of a plasma processing apparatus according to an embodiment of the present invention.

FIG. 1 is a view schematically showing the construction of a plasma processing apparatus according to an embodiment of the present invention.

In FIG. 1, the plasma processing apparatus 1 according to the embodiment of the present invention has an apparatus main body 2 and auxiliary equipment 3.

The apparatus main body 2 is comprised of a processing chamber 4 in which predetermined plasma processing is carried out on objects to be processed such as semiconductor wafers or glass substrates, for example a sequence of processes such as oxide film formation processing, etching processing, and ashing processing, an exhauster 37 that is for evacuating the interior of the processing chamber 4 and is connected to a bottom portion of the processing chamber 4 such that the processing chamber 4 is mounted thereon, and a cassette chamber 19 that is connected to the processing chamber 4 via a semiconductor wafer conveyance chamber 18 and in which are housed objects processed in the processing chamber 4.

Semiconductor wafers set in the cassette chamber 19 are conveyed into the processing chamber 4 using a conveying robot, not shown, disposed in the conveyance chamber 18.

The auxiliary equipment 3, on the other hand, is comprised of a power supply apparatus 5, which is equipment for supplying power to the apparatus main body 2 for operating the apparatus main body 2, and, for example, supplies electrical power to the processing chamber 4, a first dry pump 6 that is connected to the conveyance chamber 18 via piping 21 and evacuates the conveyance chamber 18, a second dry pump 7 that is connected to the exhauster 37 via piping 22 and evacuates the processing chamber 4 in cooperation with the exhauster 37, and a chiller unit 20 that is connected to the processing chamber 4 via piping 23 and supplies a coolant into the processing chamber 4 to cool the inside of the processing chamber 4.

The power supply apparatus 5 is, for example, comprised of a matching unit 9 that is connected to the processing chamber 4 via a power-feeding rod-shaped cable 8 (transmission path), an RF amplifier 13 that is connected to the matching unit 9 via a coaxial cable 24, and a power controller 12.

The power controller 12 has a DC amplifier 14 therein; a commercial power source 16 is connected to the DC amplifier 14 via a cable 15, and the DC amplifier 14 is connected to the RF amplifier 13 via a cable 25. An ordinary, inexpensive cable such as a parallel wire cable can be used as the cable 25.

AC power from the commercial power source 16 is converted into DC power by the DC amplifier 14, and then this DC power is supplied to the RF amplifier 13. The RF amplifier 13 supplies predetermined RF power to the matching unit 9, and after the impedance of the cable 8 has been matched by the matching unit 9 to the impedance of the plasma produced in the processing chamber 4, the supplied RF power is supplied to the processing chamber 4.

In the plasma processing apparatus 1 described above, the apparatus main body 2, the matching unit 9 of the power supply apparatus 5, and the RF amplifier 13 of the power supply apparatus 5 are disposed in a clean room A upstairs, and the dry pumps 6 and 7, the chiller unit 20, and the power controller 12 of the power supply apparatus 5 are disposed in a utility section B downstairs.

The clean room A upstairs is comprised of a first clean room A1 in which the amount of dust of 0.1 μm order is controlled to be not more than 10 particles per 0.0283 m³ (i.e. per cubic foot), and a second clean room A2 in which the amount of dust of 0.1 μm order is controlled to be not more than 100 particles per 0.0283 m³ (i.e. per cubic foot). The first clean room A1 has the cassette chamber 19 installed therein, and the second clean room A2 has the processing chamber 4, the exhauster 37, the conveyance chamber 18, the matching unit 9 and the RF amplifier 13 installed therein.

Moreover, the utility section B downstairs has the amount of dust of 0.1 μm order therein controlled to be not more than 1000 particles per 0.0283 m³ (i.e. per cubic foot), and moreover has the pressure therein set higher than the pressure outside so that air flows from the inside of the utility section B to the outside when a door is opened and closed. The utility section B downstairs has installed therein the dry pumps 6 and 7, the chiller unit 20, and the power controller 12 of the power supply apparatus 5.

As described above, the RF amplifier 13 is formed in a separate body to the DC amplifier 14 and disposed in a position away from the DC amplifier 14 and close to the matching unit 9, and hence the coaxial cable 24 connecting the RF amplifier 13 and the matching unit 9 together is made as short as possible.

A description will now be given of the operation of the plasma processing apparatus 1 shown in FIG. 1.

First, using the exhauster 37 and the second dry pump 7, the pressure inside the processing chamber 4 is reduced down to a predetermined pressure, for example approximately 0.0133 to 0.133 Pa, and using the first dry pump 6, the cassette chamber 19 and the conveyance chamber 18 are put into a reduced pressure state. After that, semiconductor wafers are set into the cassette chamber 19 from the direction of the arrow in FIG. 1, and using a conveying robot, not shown, the set semiconductor wafers are taken out from the cassette chamber 19, conveyed into the processing chamber 4 via the conveyance chamber 18, and mounted on a susceptor, not shown, inside the processing chamber 4.

Next, a processing gas such as $CF_4$ is uniformly discharged toward the susceptor using processing gas introducing means, not shown. Furthermore, the power supply apparatus 5 applies RF power between parallel plate electrodes, not shown, thus forming an RF electric field inside the processing chamber 4, and hence converting the processing gas into a plasma, whereby a plasma is produced inside the processing chamber 4. After the plasma has been produced, the wafers mounted on the susceptor are subjected to a sequence of processes such as plasma etching, and then the wafers are conveyed out using the conveying robot, whereupon the operation sequence of the plasma processing apparatus 1 comes to an end.

Figure 2A:
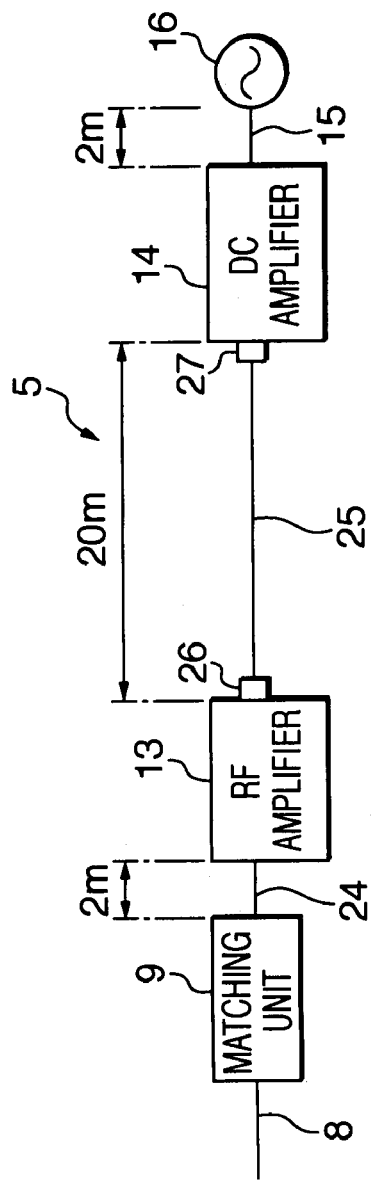
FIG. 2A is a view useful in explaining the wiring scheme for a power supply apparatus 5 shown in FIG. 1.
Figure 2B:
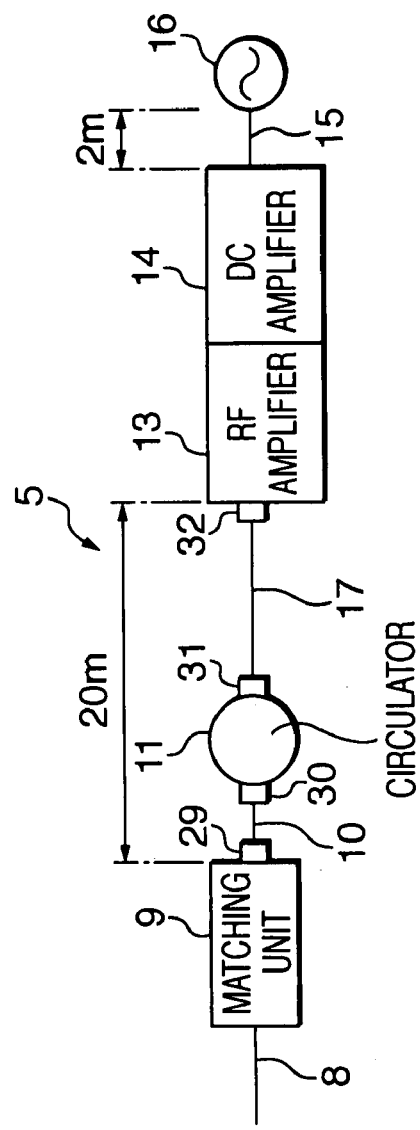
FIG. 2B is a view useful in explaining the wiring scheme for a conventional power supply apparatus 5.

FIG. 2A is a view useful in explaining the wiring scheme for the power supply apparatus 5 shown in FIG. 1, and FIG. 2B is a view useful in explaining the wiring scheme for a conventional power supply apparatus 5.

Figure 3:
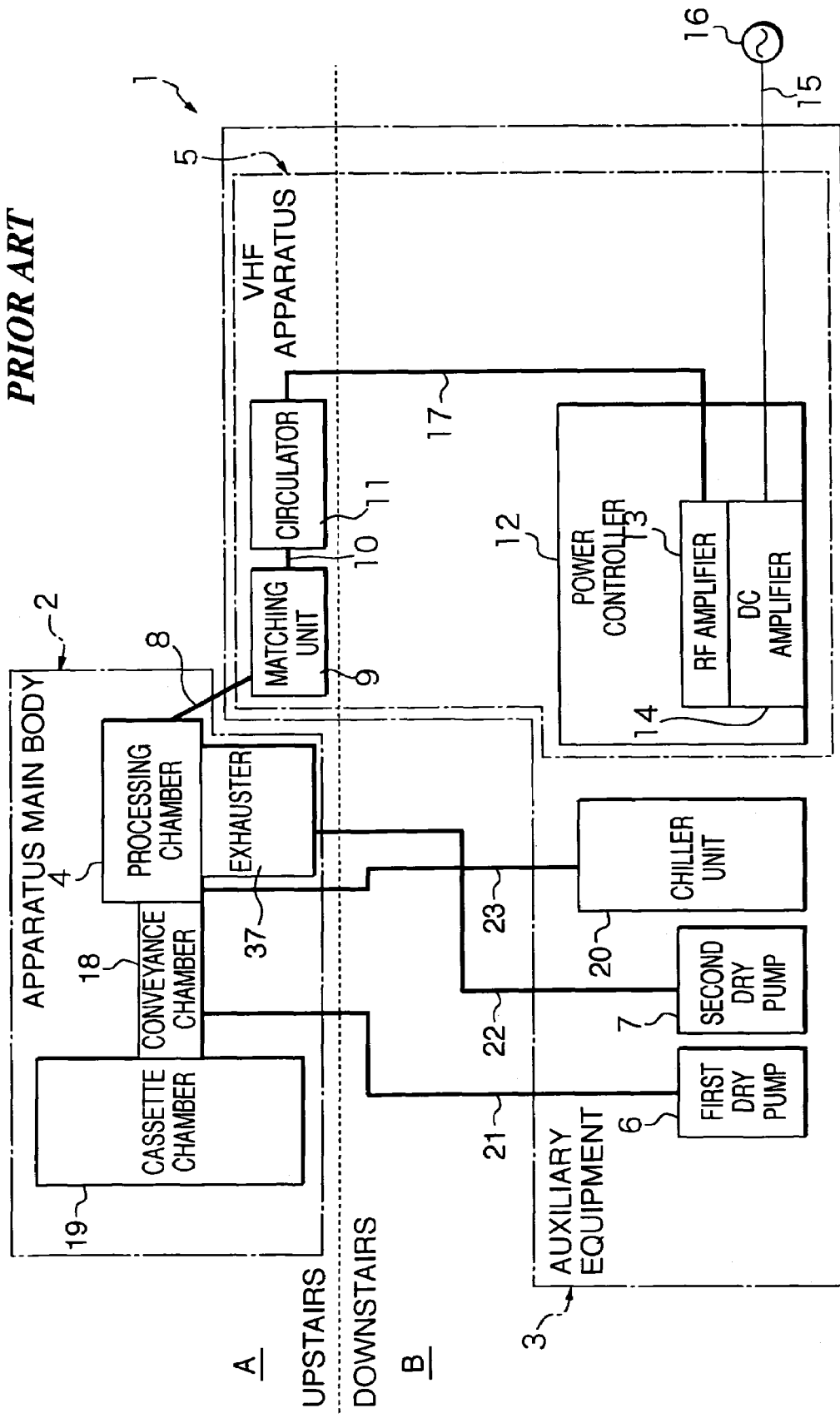
FIG. 3 is a view schematically showing the construction of a conventional plasma processing apparatus.

With the conventional power supply apparatus 5 (FIG. 3), as shown in FIG. 2B, the RF amplifier 13 is formed in one body with the DC amplifier 14, and the length of the cable 15 connecting the commercial power source 16 and the DC amplifier 14 together is 2 m, and the total length of the coaxial cables 10 and 17 connecting the RF amplifier 13 and the matching unit 9 together via the circulator 11 is 20 m. Moreover, the coaxial cable 17 connects the RF amplifier 13 and the circulator 11 together via RF connectors 32 and 31, and the coaxial cable 10 connects the circulator 11 and the matching unit 9 together via RF connectors 30 and 29.

In contrast with this, with the power supply apparatus 5 according to the present invention (FIG. 1), as shown in FIG. 2A, the RF amplifier 13 is formed in a separate body to the DC amplifier 14 and disposed in a position away from the DC amplifier 14 and close to the matching unit 9.

In FIG. 2A, the length of the cable 15 connecting the commercial power source 16 and the DC amplifier 14 together is 2 m, the length of the cable 25 connecting the DC amplifier 14 and the RF amplifier 13 together is 20 m, and the length of the coaxial cable 24 connecting the RF amplifier 13 and the matching unit 9 together is 2 m. Moreover, the cable 25 connects the DC amplifier 14 and the RF amplifier 13 together via RF connectors 27 and 26.

According to the power supply apparatus 5 of the present invention, the length of the coaxial cable 24 is thus 2m, which is much shorter than the total length, 20m, of the coaxial cables 10 and 17 in the conventional VHF apparatus 5, and moreover the number of RF connectors 26 and 27 is lower than in the conventional VHF apparatus 5.

Results of comparing the power transmission loss for the power supply apparatus 5 according to the present invention and the conventional power supply apparatus 5 will now be shown (see Table 1).

TABLE 1

|  | AC TRANSMISSION LOSS (W) | DC TRANSMISSION LOSS (W) | RF TRANSMISSION LOSS (W) | POWER LOSS DUE TO RF CONNECTORS (W) | TOTAL POWER LOSS (W) |
| --- | --- | --- | --- | --- | --- |
| PRESENT INVENTION | 3.9 | 115 | 24 | 2α | 143 + 2α |
| CONVENTIONAL APPARATUS | 3.9 | 0 | 484 | 4α | 488 + 4α |

First, in the case of using a cable of specification voltage 200V×current 20A having a cross-sectional area of 8 mm$^2$ (diameter 3 mm) and a resistance of 2.4375Ω/km as the cable 15, the power transmission loss between the commercial power source 16 and the DC amplifier 14, i.e. the AC transmission loss, was 3.9W, this being the same as in the case of the conventional power supply apparatus 5.

In the case that an ordinary cable, for example a NAN-NENFUREN (registered trademark) lead wire having a resistance of 0.0993Ω/km, was used as the cable 25, and the DC amplifier 14 outputted a power of voltage 40V×current 170A (power 6.8 kW), the power transmission loss between the DC amplifier 14 and the RF amplifier 13, i.e. the DC transmission loss, was 115V, compared with 0W in the case of the conventional power supply apparatus 5.

In the case that cables having an amplitude attenuation factor of 0.35 dB/20 m (LMR-900) were used as the coaxial cables 10, 17 and 24, a circulator having an amplitude attenuation factor of 0.3 dB was used as the circulator 11, and the RF amplifier 13 outputted a power of 3 kW, the power transmission loss between the RF amplifier 13 and the matching unit 9, i.e. the RF transmission loss was 24W, compared with 484W in the case of the conventional power supply apparatus 5.

From the above, taking the power loss due to each of the RF connectors 26, 27 and 29 to 32 to be α, the total power loss for the power supply apparatus 5 of the present invention is (143+2α)W, whereas the total power loss for the conventional power supply apparatus 5 is (488+4α)W.

According to the present embodiment, the RF amplifier 13 is formed in a separate body to the DC amplifier 14 and disposed in a position away from the DC amplifier 14 and close to the matching unit 9, and hence it is possible to shorten the distance over which RF power is transmitted, and lengthen the distance over which DC power is transmitted, and thus the cost of the power supply apparatus 5 as a whole can be reduced, and the power loss of the power supply apparatus 5 as a whole can be reduced.

According to the present embodiment described above, the connection between the DC amplifier 14 and the RF amplifier 13 is carried out via an ordinary cable 25, which has lower flexural rigidity than the coaxial cable 24, and hence the degree of freedom of the installation positions of the DC amplifier 14 and the RF amplifier 13 can be increased.

According to the present embodiment described above, the circulator 11 is built into the RF amplifier 13, and hence the reproducibility and stability of power supply can be improved, and moreover the number of RF connectors can be reduced from 4 to 2, and thus the risk of mistakes in the connection work can be reduced.

It goes without saying that the lengths of the coaxial cable 24, the ordinary cable 25, the cable 15 and so on are not limited to the lengths in the present embodiment.

Moreover, in the present embodiment, the clean room upstairs is comprised of first and second clean rooms, but there is no limitation to this in the present invention.

Moreover, in the present embodiment, the clean room is upstairs, and the utility section is downstairs, but there is no limitation to this in the present invention; for example, the clean room and the utility section may be on the same floor.

INDUSTRIAL APPLICABILITY

As described in detail above, according to the power supply apparatus of the present invention, the RF amplifier is formed in a separate body to the DC amplifier and disposed in a position away from the DC amplifier and close to the matching unit, and hence it is possible to shorten the distance over which RF power is transmitted, and lengthen the distance over which DC power is transmitted, and thus the cost of the power supply apparatus as a whole can be reduced, and the power loss of the power supply apparatus as a whole can be reduced.

Moreover, the circulator is built into the RF amplifier, and hence the reproducibility and stability of power supply can be improved, and moreover the number of RF connectors can be reduced from 4 to 2, and thus the risk of mistakes in the connection work can be reduced.

The invention claimed is:

1. A plasma processing apparatus comprising:
   a processing chamber in which objects to be processed are processed;
   power supply means for supplying RF power to said processing chamber;
   exhausting means for evacuating an interior of said processing chamber to a predetermined reduced pressure state; and
   processing gas introducing means for introducing a processing gas into said processing chamber, the plasma processing apparatus forming an RF electric field inside said processing chamber through the supplied RF power, and thus converting the introduced processing gas into a plasma, and carrying out plasma processing;

wherein said power supply means comprises:
a matching unit that is connected to said processing chamber via a transmission path along which the RF power is transmitted to said processing chamber, and that matches an impedance of said transmission path to an impedance of the processing gas that has been converted into the plasma;
an RF amplifier that is connected to said matching unit and that is disposed in a position close to said matching unit; and
a DC amplifier that is connected to said RF amplifier and that is installed in a utility section other than a clean room housing said processing chamber, said matching unit and said RF amplifier; and
wherein said DC amplifier is connected to said RF amplifier via an ordinary cable.

2. A plasma processing apparatus as claimed in claim 1, wherein said RF amplifier is connected to said matching unit via a coaxial cable.

3. A plasma processing apparatus as claimed in claim 1, wherein said utility section is disposed downstairs from said clean room.

4. A plasma processing apparatus as claimed in any one of claim 1, further comprising a circulator that is built into said RF amplifier.

5. A plasma processing apparatus comprising:
a processing chamber configured to process objects therein;
power supply apparatus configured to supply RF power to said processing chamber;
exhausting apparatus configured to evacuate an interior of said processing chamber to a predetermined reduced pressure state; and
processing gas introducing apparatus configured to introduce a processing gas into said processing chamber, the plasma processing apparatus forming an RF electric field inside said processing chamber through the supplied RF power, and thus converting the introduced processing gas into a plasma, and carrying out plasma processing;
wherein said power supply apparatus comprises:
a matching unit that is connected to said processing chamber via a transmission path along which the RF power is transmitted to said processing chamber, and that matches an impedance of said transmission path to an impedance of the processing gas that has been converted into the plasma;
an RF amplifier that is connected to said matching unit and that is disposed adjacent to said matching unit; and
a DC amplifier that is connected to said RF amplifier and that is installed in a utility section other than a clean room housing said processing chamber, said matching unit and said RF amplifier; and
wherein said DC amplifier is connected to said RF amplifier via a non-coaxial cable.

6. A plasma processing apparatus as claimed in claim 5, wherein said RF amplifier is connected to said matching unit via a coaxial cable.

7. A plasma processing apparatus as claimed in claim 6, wherein said coaxial cable comprises a coaxial cable having an amplitude attenuation factor of 0.35 dB/20 m.

8. A plasma processing apparatus as claimed in claim 5, wherein said non-coaxial cable comprises a lead wire having a resistance of 0.0993 ohms/km.

9. A plasma processing apparatus as claimed in claim 5, further comprising a circulator that is an integral part of said RF amplifier.

10. A plasma processing apparatus as claimed in claim 9, wherein said circulator has an attenuation factor of 0.3 dB.

11. A plasma processing apparatus as claimed in claim 9, wherein said RF amplifier is connected to said matching unit by way of another transmission path, wherein said another transmission path does not include RF connectors.

* * * * *